(12) United States Patent
Kelly

(10) Patent No.: US 8,299,153 B2
(45) Date of Patent: Oct. 30, 2012

(54) CURABLE AQUEOUS COMPOSITIONS

(75) Inventor: Michael Dewayne Kelly, North Wales, PA (US)

(73) Assignee: Rohm and Haas Company, Philadelphia, PA (US)

( * ) Notice: Subject to any disclaimer, the term of this patent is extended or adjusted under 35 U.S.C. 154(b) by 380 days.

(21) Appl. No.: 11/986,140

(22) Filed: Nov. 20, 2007

(65) Prior Publication Data

US 2008/0152817 A1 Jun. 26, 2008

Related U.S. Application Data

(60) Provisional application No. 60/876,882, filed on Dec. 22, 2006.

(51) Int. Cl.
*C08K 5/00* (2006.01)

(52) U.S. Cl. .................. 524/236; 427/385.5; 427/389.9; 428/500; 524/220; 524/224; 524/245; 524/247

(58) Field of Classification Search .................... 524/56, 524/58, 224, 245, 249, 384, 386, 387, 388, 524/389, 220, 236, 247; 427/385.5, 389.9; 428/500

See application file for complete search history.

(56) References Cited

U.S. PATENT DOCUMENTS

| 5,294,686 | A | 3/1994 | Fiarman et al. |
| 5,489,642 | A | 2/1996 | Gleichenhagen et al. |
| 6,136,916 | A | 10/2000 | Arkens et al. |
| 6,348,530 | B1 | 2/2002 | Rock et al. |
| 6,730,729 | B2 * | 5/2004 | Gerst et al. .................... 524/460 |
| 7,323,242 | B2 * | 1/2008 | Gerst et al. .................. 428/297.4 |
| 2003/0114562 | A1 * | 6/2003 | Sitabkhan et al. ............ 524/261 |
| 2003/0190445 | A1 | 10/2003 | Nootbaar |
| 2004/0192856 | A1 | 9/2004 | Nagel et al. |
| 2007/0006390 | A1 * | 1/2007 | Clamen et al. ................ 8/115.51 |
| 2008/0009209 | A1 * | 1/2008 | Clamen et al. .................. 442/59 |

FOREIGN PATENT DOCUMENTS

WO WO 2006/063802 A1 6/2006
WO WO 2006063802 A2 * 6/2006

* cited by examiner

*Primary Examiner* — David W Wu
*Assistant Examiner* — Marie Reddick
(74) *Attorney, Agent, or Firm* — Andrew E. C. Merriam

(57) ABSTRACT

A curable composition useful as a thermosetting binder, comprising a polycarboxy polymer or copolymer, a polyol, and, optionally, a phosphorous containing compound.

10 Claims, No Drawings

CURABLE AQUEOUS COMPOSITIONS

CROSS REFERENCE TO RELATED PATENT APPLICATIONS

This is a non-provisional patent application of U.S. provisional patent application Ser. No. 60/876,882 filed Dec. 22, 2006.

The present invention relates to curable compositions that impart improved flexibility to substrates when cured thereon, to methods of use thereof as binders for fibrous substrates and composites, and to the products produced by those methods. More particularly, the present invention relates to aqueous thermosetting binder compositions comprising one or more carboxy (co)polymer, one or more polyol having two hydroxyl groups, chosen from the group consisting of alkoxylated alkylamines, alkoxylated ether alkylamines and alkoxylated alkylamides, and the use thereof as binders for heat-resistant fibers and nonwovens.

Fibrous substrates such as heat resistant nonwovens may comprise matted fibers bonded together by a cured thermosetting resinous material. In making fiberglass insulation, for example, drawn glass fibers of random lengths are randomly deposited as a mat and, while still hot from drawing, are sprayed with an aqueous binder which is dried and cured. Due to their excellent cost/performance ratio, the thermosetting fiberglass binder resins of choice in the past have been phenol/formaldehyde resins.

Phenol/formaldehyde resins can be economically produced, and can be extended with urea prior to use as a binder in many applications. Over the past several decades however, increasingly stringent Federal regulations, increased awareness of the environmental risks posed by phenol/formaldehyde resins such as the declaration by the World Health Organization that formaldehyde is a human carcinogen have led industry to minimize formaldehyde emissions and to investigate formaldehyde free binder systems.

Existing commercial formaldehyde-free binders contain a carboxylic acid polymer and a polyol that esterify and form a thermoset when heat cured. Commercial binders have typically been designed to afford a binder that when cured is substantially rigid. For example, in fiberglass insulation binders, the cured binders must allow the insulation to be compressed, but have rigidity that allows the compressed insulation to recover substantially to its original shape once compressive forces are removed. This allows, for example, the insulation to be shipped in a rolled, compressed state and unrolled before installation to release the compression, and allow a fluffy, heat-insulating mat to be installed.

However, for other applications, the rigid binders of the type described above are undesirable. For example, in thin fiberglass or polyester mats that are to be used in roofing, the mat must be held together with a binder that allows the mat to flex substantially after the binder is cured, to allow the mat to be processed further (e.g., to convert mat into roofing material), and allow the end product containing the mat to flex well in use. For example, in roofing mat, the end roofing product may be impregnated or layered with asphaltic materials, and the resultant roofing product must retain flexibility to allow it to conform to the roof (e.g., bend over peaks and into valleys), and to allow the roofing material to expand and contract with temperature fluctuations, without the mat itself fracturing because it is too brittle and lacks flexibility.

Other applications where curable, formaldehyde-free binders are "flexible" in this regard include paper, cellulosics, polyester and glass veil. Such substrates are used in a variety of applications, including flooring underlayments, filtration media, and building products.

Commercial formaldehyde-free binders have been blended with emulsion polymers, as described, for example, in U.S. Pat. No. 6,299,936 B1. In this case, some amount of flexibility can be imparted to the cured crosslinked polyacid thermoset composition, however we believe the emulsion component of the cured thermoset is not entirely crosslinked within the network, which may detract from the strength of the cured binder. The present invention builds flexibility into the crosslinked network itself by providing a high molecular weight, soft ethoxylated crosslinker to impart flexibility to the polyacid formulation without the use of an emulsion. Thus, there is a need for new formaldehyde-free binders for making a heat-resistant nonwoven fabric with improved flexibility and strength.

This invention is a formaldehyde-free binder that retains flexibility after cure.

Accordingly, the present inventors have endeavored to provide aqueous thermosetting binders for fibrous substrates and composites that enable higher levels of flexibility than is provided by the current technology, at a cost that can compete with phenol/formaldehyde resins, and without posing the environmental hazards of formaldehydes.

The present invention provides aqueous curable compositions comprising:
(a) at least one polycarboxy polymer or copolymer comprising at least two carboxylic acid groups, anhydride groups, or salts thereof; and (b) at least one polyol having two hydroxyl groups, selected from one or more of the group consisting of alkoxylated alkylamine, or alkoxylated ether alkylamine, or alkoxylated alkylamide.

Preferably, the alkoxylated alkylamine is selected from a group of Formula I, and the alkoxylated ether alkylamine is selected from a group of Formula II, and the alkoxylated alkylamide is selected from a group of Formula III:

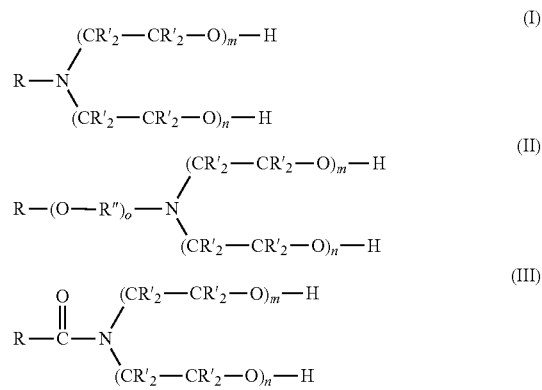

wherein:
R is an alkyl or alkylene radical having at least 6 carbon atoms or an alkylphenyl radical having at least 6 carbon atoms in the alkyl group;
R' independently at each occurrence is H or $C_{1-4}$ alkyl;
m, n and o each independently of one another is a number >1.

This invention also is a method for treating substrates with such a composition, which includes forming a curable aqueous composition comprising admixing the components of the invention with water or one or more aqueous solvent; contacting said substrate with said curable aqueous composition or, alternatively, applying said curable aqueous composition to said substrate; and heating said curable aqueous composition at a temperature of from 100° C. to 400° C. The invention also provides a fibrous article, non-woven article or composite prepared by the method for treating substrates with the composition, as described above.

Preferably, the polycarboxy (co)polymer (a) of the aqueous curable composition comprises at least one addition copolymer of (meth)acrylic acid with one or more monomers selected from the group consisting of $C_1$-$C_{12}$ alkyl(meth)acrylates, $C_1$-$C_{12}$ hydroxyalkyl(meth)acrylates, vinyl esters of $C_2$-$C_{12}$ carboxylic acids, butadiene, vinyl acetate, alkyl maleates and alkyl fumarates.

In one embodiment, the aqueous curable composition further comprises at least one polyether compound of the general formula HO—$(CR_2$—$CR_2$—$O)_x$—H, in which R independently at each occurrence is H or $C_{1-4}$ alkyl, and x is between 5 and 100,000.

In another embodiment, the aqueous curable composition further comprises at least one phosphorous-containing compound.

In another embodiment, the aqueous curable composition further comprises one or more polyols selected from the group consisting of glycerol, ethyleneglycol, diethyleneglycol, triethyleneglycol, hexanediol, trimethylolpropane, pentaerythritol, sorbitol, sucrose, glucose, triethanolamine and diethanolamine at a level of from 1% to 10% by weight on total formulation solids.

In another embodiment of the invention, the aqueous curable composition further comprises at least one low molecular weight polybasic carboxylic acid having a molecular weight of 1000 or less selected from the group consisting of ascorbic acid, aspartic acid, malic acid, crotonic acid, itaconic acid, tartaric acid, glutaric acid, maleic acid, fumaric acid, succinic acid, citric acid, adipic acid, t-cinnamic acid and mixtures thereof.

In yet another embodiment, the polycarboxy (co)polymer (a) of the aqueous curable composition is polyacrylic acid.

All ranges recited are inclusive and combinable. For example, an average particle size of 1.3 µm or more, for example, 1.5 µm or more, which may be 4.5 µm or less, or 4.0 µm or less, will include ranges of 1.3 µm or more to 4.5 µm or less, 1.5 µm or more to 4.5 µm or less, 1.5 µm or more to 4.3 µm or less, and 1.3 µm or more to 4.3 µm or less.

As used herein, the term "(meth)acrylate" means acrylate, methacrylate, and mixtures thereof and the term "(meth)acrylic" used herein means acrylic, methacrylic, and mixtures thereof.

All phrases comprising parenthesis denote either or both of the included parenthetical matter and its absence. For example, the phrase "(co)polymer" includes, in the alternative, polymer, copolymer and mixtures thereof.

As used herein, unless otherwise indicated, the phrase "copolymer" includes, independently, copolymers, terpolymers, block copolymers, segmented copolymers, graft copolymers, and any mixture or combination thereof.

As used herein, unless otherwise stated, the term "polycarboxy (co)polymer" is an oligomer, co-oligomer, polymer or copolymer with at least two carboxylic acid functional groups, anhydride groups, or salts thereof.

As used herein, the phrase "addition polymer" refers to any (co)polymer that comprises ethylenically unsaturated monomers as (co)polymerized units, such as poly(acrylic acid) (pAA).

As used herein, the phrase "aqueous" or "aqueous solvent" includes water and mixtures comprising water and one or more water-miscible solvent.

As used herein, the phrase "based on the total weight of binder solids" or "based on total binder solids" refers to weight amounts in comparison to the total amount of polycarboxy (co)polymers (a), alkoxylated alkylamines, alkoxylated ether alkylamines and alkoxylated alkylamides (b), and other polyols.

As used herein, the phrase "formaldehyde-free composition" refers to compositions substantially free from added formaldehyde, and which do not liberate substantial formaldehyde as a result of drying and/or curing.

As used herein, the phrase "gradual addition" refers to polymerization in which monomers are fed into a reaction vessel over time.

As used herein, the phrase "heat-resistant fibers" means fibers which are substantially unaffected by exposure to temperatures of from 125° C. to 400° C. during processing.

As used herein, unless otherwise indicated, the phrase "molecular weight" refers to the weight average molecular weight of a polymer as measured by gel permeation chromatography (GPC) against a polyacrylic acid standard.

As used herein, the phrase "polybasic" means having at least two reactive acid functional groups or salts or anhydrides thereof (see e.g. *Hawley's Condensed Chemical Dictionary*, 14th Ed., 2002, John Wiley and Sons, Inc.).

As used herein, the phrases "polyol" and "polyhydroxy" refer to organic compounds or structural portions of organic compounds containing two or more hydroxy groups. As such, the term "polyol" can include the alkoxylated alkylamines, alkoxylated ether alkylamines and alkoxylated alkylamides (b) of the aqueous curable composition.

As used herein, the phrase "wt. %" stands for weight percent.

As used herein, the term "oxyalkylene" refers to units having the structure: —(O-A)-, where O-A represents the monomeric residual of the polymerization reaction product of alkylene oxides. Examples of oxyalkylenes include: oxyethylene with the structure —$(OCH_2CH_2)$—; and oxypropylene with the structure —$(OC_3H_6)$—.

The formaldehyde-free curable compositions contain one or more polycarboxy (co)polymer (a). The polycarboxy (co)polymer must be sufficiently nonvolatile that it will substantially remain available for reaction with the polyol in the composition during heating and curing operations. The polycarboxy (co)polymer may be one or more polymeric polycarboxy (co)polymer, one or more low molecular weight polycarboxy (co)polymer, or mixtures thereof.

The one or more polymeric polycarboxy (co)polymer may be chosen from, for example, polyesters containing at least two carboxylic acid groups, addition (co)polymers or oligomers containing at least two copolymerized carboxylic acid-functional monomers and oligomers of polybasic acids or their salts or anyhydrides. Preferably, the one or more polymeric polycarboxy (co)polymer is chosen from addition (co)polymers formed from at least one ethylenically unsaturated monomer, most preferably polymers and copolymers of (meth)acrylic acid. The addition (co)polymers may be in the form of solutions of the addition (co)polymer in an aqueous medium.

Suitable addition (co)polymers contain at least two carboxylic acid groups, anhydride groups, or salts thereof formed from the addition polymerization of one or more ethylenically unsaturated carboxylic acids, anhydrides and salts thereof and, optionally, one or more comonomers. Ethylenically unsaturated carboxylic acids or anhydrides may include, for example, methacrylic acid, acrylic acid, crotonic acid, fumaric acid, maleic acid, 2-methyl maleic acid, itaconic acid, citraconic acid, mesaconic acid, cyclohexenedicarboxylic acid, 2-methyl itaconic acid, α-methylene glutaric acid, monoalkyl maleates, and monoalkyl fumarates, and salts thereof; ethylenically unsaturated anhydrides, such as, for example, maleic anhydride, itaconic anhydride, acrylic anhydride, and methacrylic anhydride, and salts thereof. The preferred monomers that may include carboxylic acid groups, anhydride groups, or salts are (meth)acrylic acid and maleic acid, and salts thereof, and maleic anhydride. The monomers including carboxylic acid groups, anhydride groups, or salts are used at a level of from 1 wt. % or more, based on the weight of the polymer, or 10 wt. % or more, or, 25 wt. % or more, preferably 30 wt. % or more, or, more preferably 75 wt. % or more, or, even more preferably 85 wt. % or more, and up to 100 wt. %, for example, up to 99 wt. %, or up to 90 wt. %. Suitable ethylenically unsaturated comonomers may include one or more acrylic ester monomers including methyl acrylate, ethyl acrylate, butyl acrylate, 2-ethylhexyl acrylate, decyl acrylate, methyl methacrylate, butyl methacrylate, and isodecyl methacrylate; hydroxyl group containing monomers, such as hydroxyethyl acrylate, hydroxyethyl methacrylate, hydroxypropyl methacrylate and allyloxy functional hydroxyl group-containing monomers; acrylamide or substituted acrylamides, such as t-butylacrylamide; styrene or substituted styrenes; butadiene; vinyl acetate or other vinyl esters; acrylonitrile or methacrylonitrile; and the like. Preferable comonomers include one or more ethylenically unsaturated monomer having a solubility of less than 2 g/100 g of water at 25° C., one or more allyloxy functional hydroxyl group-containing monomers; one or more phosphorous-containing comonomers, such as vinyl phosphonic acid, phosphoalkyl(meth)acrylates, or salts thereof; or one or more strong acid functional monomers, such as vinyl sulfonic acid monomers, and their salts; or mixtures of any of such comonomers.

The one or more preferred addition comonomers having a solubility of less than 2 g/100 g of water at 25° C. may be chosen from ethyl(meth)acrylate, methyl methacrylate, butyl (meth)acrylate, styrene, mono-alkyl(meth)acrylamide, di-alkyl(meth)acrylamide and t-alkyl neopentyl alkyl acrylamides. Such comonomers may be included in the addition monomer mixture in the amount of 3 or more wt. %, or 10 or more wt. %, and as much as 25 wt. % or less, or 20 wt. % or less, or 15 wt. % or less, based on the total weight of monomers used to make the addition copolymer.

The one or more preferred allyloxy functional hydroxyl group-containing monomers may be chosen from hydroxyl group-including monomers of Formula IV,

CH2=C(R1)CH(R2)OR3    (IV)

wherein R1 and R2 are independently selected from hydrogen, methyl, and —CH2OH; and R3 is selected from hydrogen, —CH2CH(CH3)OH, —CH2CH2OH, C(CH2OH)2-C2H5, and (C3-C12) polyol residues; or of Formula V,

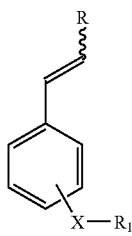
(V)

wherein R is selected from CH3, Cl, Br, and C6H5; and R1 is selected from H, OH, CH2OH, CH(CH3)OH, glycidyl, CH(OH)CH2OH, and (C3-C12)polyol residues. Such allyloxy functional hydroxyl-group containing monomers may be included in the addition monomer mixture at a level of up to 99 wt. %, or up to 70 wt. %, preferably, up to 30 wt. %, based on the total weight of the monomer mixture, and can be used in amounts of 1 wt. % or more, or 10 wt. % or more, based on the total weight of the monomer mixture. The most preferred monomers of Formula IV and Formula V are allyl alcohol and 3-allyloxy-1,2-propanediol.

The one or more polycarboxy addition (co)polymer may have a weight average molecular weight of 1000 or more, or 20,000 or more, or advantageously 50,000 or more, and the molecular weight may range as high as to 250,000; and most preferably is about 75,000.

In another embodiment of the present invention the polycarboxy (co)polymer addition (co)polymers may be oligomers or co-oligomers of ethylenically-unsaturated carboxylic acids prepared by free radical addition polymerization, having a number average molecular weight of between 300 and 900.

The one or more polycarboxy (co)polymer addition (co)polymer is preferably prepared by solution polymerization techniques for polymerizing ethylenically-unsaturated monomers which are well known in the art.

The polymerization reaction to prepare the copolymer component can be initiated by various methods known in the art, such as, preferably, by using the thermal decomposition of one or more initiators, or, for example, by using an oxidation-reduction reaction ("redox reaction") to generate free radicals to effect the polymerization. Preferred thermal initiators may comprise peracids, such as persulfates, perborates, and periodates. Redox initiator systems may contain at least one peroxide-containing compound in combination with a redox co-initiator, for example, a reductive sulfur compound such as a bisulfite, sulfite, thiosulfate, dithionite, or tetrathioate of alkali metals and ammonium compounds. Thus, it is possible to employ combinations of peroxodisulfates with alkali metal hydrogen sulfites or ammonium hydrogen sulfites, for example, ammonium peroxydisulfate and ammonium disulfite. The ratio of peroxide-containing compound to redox co-initiator is typically from 30:1 to 0.05:1.

In the effective selection of one or more thermal initiators, the thermal decomposition temperature of the selected initiator should correspond to the one or more polymerization temperatures. Thus, if the reaction mixture is initially polymerized partly at the lower limit of the temperature range appropriate for polymerization, and is then polymerized to completion, at a higher temperature, it is expedient to use at least two different initiators which decompose at different temperatures, so that there is sufficient concentration of free radicals available within each temperature range.

In combination with the initiators, it is possible to use, in addition, transition metal catalysts, such as salts of iron, cobalt, nickel, copper, vanadium, and manganese. Suitable salts include, for example, iron (II) sulfate, cobalt (II) chloride, nickel (II) sulfate, and copper (I) chloride. The reductive transition metal salt may be used in a concentration of from 0.1 to 1,000 ppm, based on the monomers in the curable composition.

Preferably, the addition (co)polymer may be polymerized in the presence of one or more chain transfer agents to prepare (co)polymers of low average molecular weight. Customary regulators may be used, for example, organic compounds containing SH groups, such as 2-mercaptoethanol, 2-mercaptopropanol, mercaptoacetic acid or esters thereof, mercaptopropionic acid or esters thereof, tert-butylmercaptan, n-octylmercaptan, n-dodecylmercaptan, and tert-dodecymercaptan; $C_1$-$C_4$ aldehydes, such as acetaldehyde, propionaldehyde; hydroxylammonium salts, such as hydroxylammonium sulfate; formic acid; sodium bisulfite or isopropanol. The addition (co)polymer may be formed in the presence of a phosphorous-containing regulator, such as, for example, hypophosphorous acid and its salts, e.g. sodium hypophosphite, as is disclosed in U.S. Pat. No. 5,294,686, so as to incorporate the optional phosphorous-containing species in the polycarboxy (co)polymer molecule. The regulators are generally used in amounts of from 0 to 40 weight percent, preferably from 0 to 15 weight percent, based on the weight of the monomers in the curable composition.

The addition (co)polymers can be prepared in water or in solvent/water mixtures such as, for example, i-propanol/water, tetrahydrofuran/water, and dioxane/water.

The preferred method of polymerization is by gradual addition solution polymerization in water. In this method, part, or all of the ethylenically unsaturated (co)monomer or monomer mixture can be metered into the reactor. The manner in which the (co)monomers may be fed to a reaction container or vessel may vary. No matter the method of polymerization, the preferred total feed time, i.e. the time required to feed all of the reaction mixture into the reaction container, may range 2 hours or less, more preferably, 1 hour or less.

In one embodiment of the method of polymerization, the composition of the monomer feeds remains substantially the same throughout the polymerization process. Alternatively, to limit the gel content of any addition (co)polymerization product, the comonomer feed composition may be adjusted during the duration of the raw material feeds. In yet another embodiment, the method of polymerization, the (co)monomers or mixtures thereof may be fed by a semi-continuous feed. In the preferred methods of polymerization of the addition (co)polymer, the reaction container contains an initial charge of a reaction mixture comprising 10 wt. % or more of the total amount of chain transfer agent used, and a single constant feed of the remainder of the chain transfer agent is fed continuously from a monomer vessel into the reaction container.

To improve solubility in aqueous media, the carboxylic acid groups, anhydride groups, or salts thereof of the one or more addition (co)polymer may be neutralized with one or more fixed or volatile base. Preferably, the carboxylic acid groups, anhydride groups, or salts of the addition (co)polymer may be neutralized with a volatile base. By "volatile base" is meant herein one or more base which is substantially volatile under the conditions of treatment of the substrate with the curable composition. By "fixed" base is meant herein, a base which is substantially non-volatile under the conditions of treatment of the substrate with the curable composition.

Use of volatile bases permits curing of the binder composition without a strong acid catalyst, where such curing is possible. Suitable volatile bases include, for example, ammonia or volatile lower alkyl amines. Suitable fixed bases include, for example, sodium hydroxide, potassium hydroxide, sodium carbonate, and t-butylammonium hydroxide. The fixed base is sufficiently nonvolatile that it will substantially remain in the curable composition during heating and curing operation. The volatile base can be used in addition to the fixed base. Fixed multivalent bases such as, for example, calcium carbonate, may tend to destabilize aqueous dispersions if the copolymer component is used in the form of an aqueous dispersion, however, they can be used in minor amounts.

The amount of one or more base utilized may be such that the carboxylic acid groups, anhydride groups, or salts thereof of the addition (co)polymer are neutralized to an extent of less than 35%, or less than 20%, or less than 5%, calculated on an equivalents basis. It is preferred not to use any neutralizing base.

The curable aqueous composition comprises at least one polyol chosen from the group consisting of alkoxylated alkylamines, alkoxylated ether alkylamines and alkoxylated alkylamides (b). The preferred such polyols, respectively, are represented by the formulas I, II, and III, given above. A particularly preferred alkoxylated alkylamine is available commercially as an ethoxylated fatty alkylamine, Chemeen™ C10 (PCC Chemax, Inc., Piedmont, S.C., USA), and the related series of compounds. The designation "C10" for this dihydroxy compound relates to the average degree of ethoxylation attached to the amine nitrogen, which in this case means that each of the two chains of ethoxylation attached to the amine nitrogen of this molecule contains, on average, ten oxyethylene units. That is to say that m and n in FIG. I are equal to 10. Other related compounds are available with varying degrees of alkoxylation (i.e. varying in value of m and n, according to FIG. I). The "R" group of FIGS. I, II, and III is generally, and preferably, the alkyl group associated with the alkyl group of the fatty acid used as the precursor for forming the amine polyol. For this reason, the "R" group may optionally include a site of unsaturation, so "R" may be an alkyl or an alkylene group. The larger the "R" group, the more flexible the polyol, and thus the more flexible the cured thermoset resulting from the inventive compositions.

The polyol (b) must be sufficiently nonvolatile that it will substantially remain available for reaction with the polycarboxy (co)polymer in the composition during heating and curing operations.

The ratio of the number of equivalents of carboxy, anhydride, or salts thereof in the curable compositions, i.e. the one or more polycarboxy (co)polymer (a), to the total number of equivalents of hydroxyl in the polyol (b) is from about 1/0.001 to about 1/2.5, preferably from 1/0.005 to 1/2. To avoid an excess of volatile organic compounds (VOC's) and insure formation of a good cure network, an excess of equivalents of carboxy, anhydride, or salts thereof to the equivalents of hydroxyl in the curable compositions is preferred. Thus, the ratio of the number of equivalents of carboxy, anhydride, or salts thereof to the number of equivalents of hydroxyl in the polyol can be 1/0.01 or less, but most preferably it is from about 1/0.01 to about 1/1.5.

Preferably, the curable aqueous composition also contains one or more phosphorous-containing accelerator which may be a compound such as those disclosed in U.S. Pat. No. 6,136,916. Preferably, the accelerator is selected from the group consisting of sodium hypophosphite, sodium phosphite, or a mixture thereof. The phosphorous-containing accelerator can also be one or more (co)oligomer bearing phosphorous-containing groups added to the curable compositions, for example, a (co)oligomer of acrylic acid formed in the presence of sodium hypophosphite by addition polymerization. Further, the one or more phosphorous-containing accelerator may comprise part of the polycarboxy (co)polymer (a) as an oligomer or (co)polymer bearing phosphorous-containing groups such as, for example, addition (co)polymers of acrylic and/or maleic acids and, optionally, ethylenically unsaturated comonomers, e.g. those having a solubility of less than 2 g/100 g of water at 25° C., or combinations thereof, formed in the presence of sodium hypophosphite; polymeric polycarboxy (co)polymer addition copolymers comprising phosphorous-containing monomer residues such as, for example, copolymerized phosphoethyl methacrylate and like phosphonic acid esters, and their salts. The one or more phosphorous-containing accelerator may be used at a level of from 0 wt. % to 40 wt. %, based on the combined weight of the polycarboxy (co)polymer and the polyol. The phosphorous-containing accelerators may be used in the amount of 0.1 wt. % or more, based on the total weight of binder solids, and up to 25 wt. %, or up to 20 wt. %, or, preferably, up to 15 wt. %, and, more preferably, up to 12 wt. %. When the phosphorous-containing accelerator comprises part of an addition (co)polymer, the wt. % of the phosphorous-containing accelerator is based on/determined by wt. % of hypophosphite, phosphinate or phosphonate charged to the reactor as a fraction of the total batch solids.

Thus, a particularly advantageous embodiment provides a curable thermoset composition utilizing a polycarboxy copolymer of acrylic acid and ethyl acrylate (70:30 ratio) with a weight average molecular weight of about 75,000 in combination with an alkoxylated alkylamine such as Chemeen™ C10, optionally with one or more other polyols, such that the ratio of carboxy groups to —OH groups is about 1.0/0.07, and using 5% SHP as a phosphorous containing catalyst.

The curable composition may be prepared by admixing the one or more polycarboxy (co)polymer, the one or more polyol, and, if desired, the one or more phosphorous-containing accelerator and any additional ingredients using conventional mixing techniques.

In one embodiment of the invention, the curable composition further contains at least one low molecular weight polybasic carboxylic acid, anhydride or salt thereof having a molecular weight of 1000 or less, preferably 500 or less, and most preferably 200 or less. Thus, optionally, one or more low molecular weight polybasic carboxylic acid, anhydride or salt thereof may be mixed with one or more polyol (b), under reactive conditions, prior to mixing with one or more polycarboxy (co)polymer (a). Examples of suitable low molecular weight polybasic carboxylic acids and anhydrides include, for example, maleic acid, maleic anhydride, fumaric acid, succinic acid, succinic anhydride, sebacic acid, azelaic acid, adipic acid, citric acid, glutaric acid, tartaric acid, itaconic acid, trimellitic acid, hemimellitic acid, trimesic acid, tricarballytic acid, 1,2,3,4-butanetetracarboxylic acid, pyromellitic acid, oligomers of carboxylic acid, and the like. As discussed above, in certain embodiments, the (co)polymer composition can include an accelerator. The accelerator may be present during this reaction, which can be an in-situ reaction, or alternatively, the accelerator may be added to the composition after completion of this in-situ reaction and prior to mixing with the polycarboxy (co)polymer.

In another embodiment, the aqueous curable composition further comprises at least one fatty alcohol mono-functional hydroxyl compound selected from the group consisting of capryl alcohol, capric alcohol, lauryl alcohol, cetyl alcohol, linoleyl alcohol, oleyl alcohol, myristyl alcohol, montanyl alcohol, and myricyl alcohol.

In another embodiment, the aqueous curable composition further comprises at least one glycol ether mono-functional hydroxyl compound selected from the group consisting of ethylene glycol monomethyl ether, propylene glycol monomethyl ether, diethylene glycol monomethyl ether, dipropylene glycol, dipropylene glycol monomethyl ether, and ethylene glycol n-butyl ether.

In another embodiment, the aqueous curable composition further comprises at least one strong acid such as sulfuric acid, nitric acid or sulfonic acids such as p-toluene sulfonic acid.

In another embodiment, the aqueous curable composition further comprises at least one polysaccharide, selected from the group consisting of starch, cellulose, gums, alginates, pectin, gellan and modifications or derivatives thereof which are provided by etherification, esterification, acid hydrolysis, dextrinization, oxidation or enzyme treatment.

In another embodiment, the aqueous curable composition further comprises urea.

In yet another embodiment, the aqueous curable composition further comprises at least one water-soluble lignin selected from the group consisting of sodium lignosulfonate, low-molecular weight maltodextrin, and soybean protein.

Water may be admixed with the remainder of the composition optionally at the point of use, and not before, to minimize shipping weight. The total solids of the curable compositions of the present invention may range up to 100 wt. %, based on the total weight of the composition, as in with an anhydrous and solvent free or a dried binder composition, or up to 70 wt. %, as is the case with solutions or dispersions, or up to 60 wt. %, or up to 50 wt. %; such total solids may range as low as 0.5 wt. % or more, or 1 wt. % or more, or 3 wt. % or more, or 5 wt. % or more. The total solids of the curable compositions may be selected to provide compositions having a suitable viscosity for various means of treating substrates. For example, sprayable curable compositions may have a total solids of 5 wt. %. However, substrates may be dipped in or themselves contacted with curable compositions having a total solids of 10 wt. % or more. As used herein, the term "total solids" refers to the sum of the total amount of binder solids, plus any fillers or extenders.

The composition of this invention can comprise, in addition, conventional treatment components such as, for example, emulsifiers; pigments; fillers or extenders; anti-migration aids; curing agents; coalescents; surfactants, particularly nonionic surfactants; spreading agents; mineral oil dust suppressing agents; biocides; plasticizers; organosilanes; anti-foaming agents such as dimethicones, silicone oils and ethoxylated nonionics; corrosion inhibitors, particularly corrosion inhibitors effective at pH<4 such as thioureas, oxalates, and chromates; colorants; antistatic agents; lubricants; waxes; anti-oxidants; coupling agents such as silanes, particularly Silquest™ A-187 (manufactured by GE Silicones—OSi Specialties, located in Wilton, Conn., USA); Wetlink Silanes from GE (e.g., Wetlink 78), and Dynasylan™ silanes from Degussa particularly, epoxy silanes such as, but not limited to, Dynasylan™ GLYMO and GLYEO; and oligomeric silanes such as HYDROSIL™. Also, polymers not of the present invention; and waterproofing agents such as silicones and emulsion polymers, particularly hydrophobic emulsion polymers containing, as copolymerized units, greater than 30% by weight, based on the weight of the emulsion polymer solids, ethylenically-unsaturated acrylic monomer containing a C5 or greater alkyl group.

The composition of this invention is preferably formaldehyde-free. "Formaldehyde-free" means that the composition is substantially free from formaldehyde, nor does it liberate substantial formaldehyde as a result of drying and/or curing. To minimize the formaldehyde content of the (co)polymer composition it is preferred, when preparing a polymer of the present invention, to use polymerization adjuncts such as, for example, initiators, reducing agents, chain transfer agents, biocides, surfactants, and the like, which are themselves free from formaldehyde, do not generate formaldehyde during the polymerization process, and do not generate or emit formaldehyde during the treatment of a substrate. Likewise, it is preferable that any formulation additives be similarly formaldehyde free. "Substantially free from formaldehyde"

means that when low levels of formaldehyde are acceptable in the waterborne composition or when compelling reasons exist for using adjuncts which generate or emit formaldehyde, substantially formaldehyde-free waterborne compositions can be used.

The composition of this invention may be used for treating various substrates. Such treatments can be commonly described as, for example, coating, sizing, saturating, bonding, combinations thereof, and the like. Typical substrates include wood, including, for example, solid wood, wood particles, fibers, chips, flour, pulp, and flakes; metal; plastic; fibers such as polyester, glass fibers; woven and non-woven fabrics; and the like and their composite fibers. The (co)polymer composition can be applied to a substrate by conventional techniques such as, for example, air or airless spraying, padding, saturating, roll coating, foam coating, curtain coating, beater deposition, coagulation, or the like.

In one embodiment of this invention, the composition can be used as a binder for heat-resistant non-woven fabrics such as, for example, non-wovens which contain heat-resistant fibers such as, for example, aramid fibers, ceramic fibers, metal fibers, carbon fibers, polyimide fibers, certain polyester fibers, rayon fibers, rock wool, and glass fibers. "Heat-resistant fibers" mean fibers which are substantially unaffected by exposure to temperatures above 125° C. Suitable nonwoven fabric substrates may comprise fibers that have been consolidated by purely mechanical means such as, for example, by entanglement caused by needle-punching, by an air-laid process, or by a wet-laid process; by chemical means, such as, for example, treatment with a polymeric binder; or by a combination of mechanical and chemical means before, during, or after nonwoven fabric formation. Heat-resistant non-wovens can also contain fibers which are not in themselves heat-resistant such as, for example, certain polyester fibers, rayon fibers, nylon fibers, and super-absorbent fibers, in so far as they do not materially adversely affect the performance of the substrate.

Non-woven fabrics incorporating a (co)polymer composition should substantially retain the properties contributed by the cured aqueous composition such as, for example, tensile strength, and not substantially detract from essential non-woven fabric characteristics. The cured composition should not be too rigid or brittle, or become sticky under processing conditions.

The curable aqueous (co)polymer composition, after it is applied to a substrate, is heated to effect drying and curing. The duration and temperature of heating will affect the rate of drying, processability, handleability; and property development of the treated substrate. Heat treatment at from 120° C. to 400° C. for a period of time between from 3 seconds to 15 minutes can be carried out; treatment at from 175° C. to 225° C. is preferred. "Curing" means a chemical or morphological change which is sufficient to alter the properties of the (co)polymer such as, for example, via covalent chemical reaction, ionic interaction or clustering, improved adhesion to the substrate, phase transformation or inversion, hydrogen bonding, and the like. The drying and curing functions can be performed in two or more distinct steps, if desired. For example, the composition can be first heated at a temperature and for a time sufficient to substantially dry but not to substantially cure the composition, and then heated for a second time at a higher temperature and/or for a longer period of time to effect curing. Such a procedure, referred to as "B-staging," can be used to provide binder-treated nonwoven, for example, in roll form, which can at a later stage be cured, with or without forming or molding into a particular configuration, concurrent with the curing process.

The heat-resistant non-wovens can be used for applications such as, for example, insulation batts or rolls to be used in ovens and in building construction, as reinforcing mats for roofing or flooring applications, as roving, as microglass-based substrates for printed circuit boards, as battery separators, as filter stock, e.g. for air duct filters, as tape stock, as reinforcement scrim in cementitious and non-cementitious coatings for masonry, or as abrasives; wovens, non-wovens and composites for use as abrasives and stock or prepregs therefor, e.g. brake shoes and pads, clutch plates, or as sheets or panels, as in ceiling tiles; and mineral or glass fiber-containing heat-resistant nonwoven fabrics impregnated with hot asphaltic compositions, for example, at temperatures of from 150° C. to 250° C. to make roofing shingles or roll roofing materials.

The non yellowing flexible binders of the invention are also useful for bonding wood chips, abrasive matts, decorative laminate paper, laminating adhesives, filtration paper, or cotton rag bonding for automotive sound insulation.

As polycarboxy (co)polymers can be corrosive to certain types of processing equipment, particularly those made from soft steel, certain types of corrosion control may preferably be practiced when handling solutions containing such polycarboxy (co)polymers. These practices can include, for example, pH control, reducing use of or eliminating strong acids, reducing use of phosphorous-containing accelerators and polymers containing them, and using materials such as stainless steel in the process equipment itself instead of more corrosive material.

The following non-limiting examples illustrate the curable aqueous composition and the use thereof as a binder for heat-resistant nonwovens.

EXAMPLES

Example 1

Synthesis of Polycarboxy Solution (Co)Polymers

Example 1A

Solution Synthesis Polymer 1A

All solution samples were prepared by the same procedure. A 5-liter round-bottom flask equipped with a paddle stirrer, thermocouple, nitrogen inlet, and reflux condenser was charged with a mixture of 1207 grams of deionized water and heated to 72-74° C. At temperature, 20.6 grams of 0.15% ferrous sulfate solution was added, followed by a 2 minute hold. A monomer mix was prepared according to the recipe shown in Table 1. After hold, and at temperature, the monomer mix and a solution of 16.08 grams of sodium persulfate in 236 grams of deionized water was gradually added over 90 minutes and a solution of sodium metabisulfite (15.3 grams in 214 grams deionized water) was gradually added over 85 minutes while maintaining reaction temperature of 72-74° C. After this addition was complete, the reaction mixture was held at 72° C. for 15 minutes. A chase solution of 3.06 grams of sodium persulfate was dissolved in 40 grams of deionized water and gradually added over 30 minutes. When the feed was complete, the reaction mixture was held for twenty minutes at 72-74° C. After the hold period, the reaction mixture was cooled to room temperature. At 45° C. or below, 1.0 gram of a 30% solution of hydrogen peroxide was added slowly to reduce sulfite to zero. The resulting solution polymer had a solids content of roughly 47.1%.

TABLE 1

Monomer mix recipe for polymer 1A (weights in grams)

|  | Example 1A |
|---|---|
| Deionized water | 0 |
| Ethyl acrylate | 459 |
| Acrylic acid | 1072 |

Example 1B

Solution Synthesis Polymer 1B

A 5-liter round-bottom flask equipped with a paddle stirrer, thermocouple, nitrogen inlet, and reflux condenser was charged with 535 grams of deionized water and heated to 92° C. At temperature, 35 grams of 45% SHP solution was added, followed by a 15 minute hold while allowing to cool to 86° C. A monomer mix of ethyl acrylate and acrylic acid was prepared according to the recipe shown in Table 2. After hold, and at temperature, the monomer mix and separate solutions of 15 grams of sodium persulfate in 93 grams of deionized water and 33.4 grams of a 45% solution of sodium hypophosphite were gradually added while allowing the temperature to rise to a reaction temperature of 92° C. over 85 minutes. After this addition was complete, the reaction mixture was held at 92° C. for 20 minutes, then cooled to 75° C. A solution of 3.0 grams of a 0.15% solution of ferrous sulfate was added to the reaction mixture. A solution of 1.3 grams of aqueous tert-butylhydroperoxide (70%) diluted with 10.0 grams of deionized water and a solution of 0.45 grams of isoascorbic acid in 10.0 grams of deionized water were added as shots in one minute increments and held for twenty minutes. This step was repeated. After holding at temperature, the reaction was cooled to room temperature and a blind dilution of deionized water was added below 40° C. The resulting solution polymer had a solids content of roughly 46.5%.

TABLE 2

Monomer mix recipe for polymer 1B (weights in grams)

|  | Example 1B |
|---|---|
| Deionized water | 265 |
| Ethyl acrylate | 450 |
| Acrylic acid | 1050 |

Example 1C

Solution Synthesis Polymer 1C

A 5-liter round-bottom flask equipped with a paddle stirrer, thermocouple, nitrogen inlet, and reflux condenser was charged with a mixture of 1070.6 grams of deionized water and heated to 72-74° C. At temperature, 1.23 grams of Sodium Metabisulfite dissolved in 14.3 grams of deionized water and 17.1 grams of 0.15% Ferrous Sulfate solution was added seperately to the kettle followed by a 2 minute hold. A monomer mix was prepared according to the recipe shown in Table 3. After hold, and at temperature, the monomer mix was gradually added over 120 minutes and a solution of 31.65 grams of Sodium Persulfate in 190 grams of deionized water was gradually added over 122 minutes and a solution of Sodium Metabisulfite (26.8 grams in 214 grams deionized water) was gradually added over 115 minutes while maintaining reaction temperature of 72-74° C. After this addition was complete the reaction mixture was held at 72° C. for 15 minutes. A chase solution of 3.8 grams of Sodium Persulfate was dissolved in 20.1 grams of deionized water and gradually added over 30 minutes. When the feed was completed, the reaction mixture was held for twenty minutes at 72-74° C. After the hold period, the reaction mixture was cooled to room temperature. At 45° C. or below, 1.0 gram of a 30% solution of hydrogen peroxide was added slowly to reduce the sulfite level to zero. The resulting solution polymer had a solids content of roughly 47.1%.

TABLE 3

Monomer mix recipe for polymer 1C (weights in grams)

|  | Example 1C |
|---|---|
| Deionized water | 300 |
| Acrylic acid | 1712 |

Example 2

Preparation of Aqueous Curable Thermoset Compositions

Aqueous curable thermoset compositions were prepared using the following polycarboxy (co)polymers prepared in Example 1:

Ex. 1A 70 AA/30 EA//1.0% SMBS (Mw: 80,200; Mn: 18,700)

Ex. 1B 70 AA/30 EA//1.0% SHP (Mw: 48,000; Mn: 8,000)

Ex. 1C 100 AA//1.2% SMBS (Mw: 59,000; Mn: 11,000)

The compositions were prepared by simple admixture, with stirring, of the components shown below in Table 4.

TABLE 4

Composition of aqueous curable thermoset samples 1-14 (quantities in grams)

| Sample | Polymer | Polyol(s) | Accel. | Base | H$_2$O |
|---|---|---|---|---|---|
| 1 | 100 Ex. A | 1.13 TEOA | 1.43 SHP | 0.41 amm. | 382.6 |
| 2 | 100 Ex. A | 4.52 TEOA | 2.85 SHP | 0 | 417.8 |
| 3 | 100 Ex. A | 4.86 Chemeen C10 | 1.43 SHP | 3.85 amm. | 412.9 |
| 4 | 100 Ex. A | 9.72 Chemeen C10 | 1.43 SHP | 4.49 amm. | 456.0 |
| 5 | 100 Ex. A | 4.86 Chemeen C10 | 1.43 SHP | 17.27 NaOH | 399.5 |
| 6 | 100 Ex. A | 9.72 Chemeen C10 | 1.43 SHP | 15.58 NaOH | 444.9 |
| 7 | 100 Ex. B | 1.12 TEOA | 1.42 SHP | 0.29 amm. | 379.1 |
| 8 | 100 Ex. B | 4.49 TEOA | 2.83 SHP | 0 | 414.0 |
| 9 | 100 Ex. B | 4.86 Chemeen C10 | 1.42 SHP | 4.17 amm. | 393.5 |
| 10 | 100 Ex. B | 9.72 Chemeen C10 | 1.42 SHP | 4.46 amm. | 421.3 |
| 11 | 100 Ex. B | 4.83 Chemeen C10 | 1.42 SHP | 12.46 amm. | 400.5 |
| 12 | 100 Ex. B | 9.65 Chemeen C10 | 1.42 SHP | 13.08 amm. | 443.3 |
| 13 | 100 Ex. B | 3.30 Chemeen C10 | 1.42 SHP | 4.17 amm. | 395.1 |
| 14 | 100 Ex. B | 6.59 Chemeen C10 | 1.42 SHP | 3.86 amm. | 425.0 |

All formulations contain Triton X-114 at <0.1% to wet the polyester substrate.
Chemeen™ C10 (PCC Chemax, Inc., Piedmont, SC, USA) is an ethoxylated fatty alkyl amine, 100% active ingredient.
amm. = concentrated ammonium hydroxide solution, 28%. The base aids in solubilizing the Chemeen™ C10.
NaOH = 15% by weight sodium hydroxide dissolved in water.
SHP is sodium hypophosphite, added as 45% solution by weight in water.
TEOA is triethanolamine (99% active ingredient).

Example 3

Treatment of Polyester Mat and Tensile Testing of Treated Substrate

Test Methods—Mat Preparation

Commercial spunbound needle-punched polyester mat (150 g/m$^2$; non-treated) was cut into 38 cm×30 cm sheets. A sheet was dip coated in each test sample binder composition at 10% bath solids (by weight) and then run through a roll padder with roll pressures of 40 psi to obtain a binder add-on weight of 20%±1% (dry binder weight as a percentage of substrate weight). The coated substrate was then immediately cured by heating at 205° C. for 3 minutes in a Mathis Oven that is vented or equipped with a devolatilizer.

Tensile Strength, Elongation and Width Retention

An Instron 4201 tensile tester equipped with a 1 kN load cell and an oven chamber encasing the jaws with temperature range capability of −100 to 400° F. (−73° C. to 204° C.) was used for both room temperature tensile strength (RT TS) and elongation (RT elong.), and high temperature tensile strength (hot TS) and width retention (hot width).

For RT tensile strength and RT elongation, a cured sheet was cut into 4 cm×25 cm strips. Strips were tested by placing them in the jaws of the tensile tester and pulled apart, at room temperature (~23° C.), at a crosshead speed of 8 inches/minute (approx. 20 cm/min) with a 15 cm gap. Tensile strengths were recorded as the peak force measured during parting (Table 5). The maximum percent elongation was also recorded. The data reported are averages of 4 test strips for each binder composition tested.

For high temperature tensile strength and width retention a cured sheet was cut into 2.5 cm×30 cm strips. The oven chamber of the tensile tester was pre-heated to 375° F. (190° C.) prior to testing. Once pre-heated, the strips were placed in the jaws and the oven chamber closed and equilibrated back to 375° F. The samples were then pulled apart at a crosshead speed of 20 cm/minute with a 15 cm gap. Hot Tensile Strength was measured at 20% elongation. Hot Width Retention was calculated by measuring the width of the test strip at the narrow point and dividing this by the initial width, expressed as a percentage. Hot Width Retention is a measure of the thermal dimensional stability of the substrate.

TABLE 5

Hot and room temperature tensile test and elongation results (samples 1-14)

| Sample | Hot TS (N) | Hot Width (%) | RT TS (N) | RT Elong. (%) |
|---|---|---|---|---|
| 1 | 146 | 80 | 364 | 33 |
| 2 | 164 | 83 | 388 | 29 |
| 3 | 147 | 84 | 426 | 52 |
| 4 | 162 | 83 | 413 | 47 |
| 5 | 168 | 85 | 407 | 49 |
| 6 | 172 | 83 | 419 | 46 |
| 7 | 155 | 81 | 369 | 28 |
| 8 | 175 | 84 | 364 | 24 |
| 9 | 152 | 82 | 362 | 45 |
| 10 | 163 | 84 | 419 | 42 |
| 11 | 168 | 83 | 363 | 47 |
| 12 | 170 | 84 | 386 | 42 |
| 13 | 144 | 79 | 356 | 46 |
| 14 | 161 | 82 | 399 | 43 |
| Comp. 1 | 120 | 76 | 327 | 18 |
| Comp. 2 | 144 | 82 | 510 | 48 |

Comparative 1 is Aquaset ™ 600 (Rohm and Haas Company, Philadelphia, USA).
Comparative 2 is a blend of styrene/acrylic latex and melamine formaldehyde resin at 90/10 weight ratio.

In Table 5, samples labelled Comp. 1 and Comp. 2 represent control samples. Comp. 2 represents an optimized system for the previous generation technology which uses the undesirable melamine-formaldehyde crosslinking systems. Comp. 2 has very good tensile strength properties (hot TS and room temperature TS), as well as good room temperature elongation and acceptable hot width retention. Indeed, in this respect the industry is struggling to replace this technology. Comp. 1 is a commercial thermosetting binder, Aquaset™ 600, which is crosslinked with triethanolamine. The data in Table 5 show that this next generation formaldehyde-free technology is comparatively deficient in flexibility and room temperature tensile strength.

Samples 1 and 2 also use triethanolamine as the crosslinking polyol, and both samples have similarly poor flexibility as shown by the low room temperature elongation.

Using the same polycarboxy polymer (1A), inventive samples 3-6 show that a good balance of properties can be achieved when Chemeen C10 (alkoxylated alkylamine) is used as the crosslinking polyol, including excellent room temperature elongation and good tensile strength. A similar comparison, and similar result, is shown for polymer 1B (using triethanolamine crosslinker in samples 7 and 8, and using the inventive alkoxylated alkylamine crosslinker in samples 9-14).

Example 4

Effect of Polyethylene Glycol on Mechanical Properties of Cured Thermosets

Additional experiments were performed on curable thermoset compositions to investigate the effect of various polyethylene glycols on the mechanical properties of cured thermosets.

TABLE 6

Composition of aqueous curable thermoset samples 15-22 (in grams)

| Sample | Polymer | Polyol(s) | amm. | PEG | H$_2$O |
|---|---|---|---|---|---|
| 15 | 100 Ex. C | 57.35 Chemeen C10 (10%) | 26.4 | 10.0 PEG-35 | 407.7 |
| 16 | 100 Ex. C | 57.35 Chemeen C10 (10%) | 28.5 | 20.0 PEG-35 | 423.3 |
| 17 | 100 Ex. C | 57.35 Chemeen C10 (10%) | 0 | 10.0 PEG-8 | 432.9 |
| 18 | 100 Ex. C | 57.35 Chemeen C10 (10%) | 26.4 | 4.30 PEG-20 | 425.8 |
| 19 | 100 Ex. C | 57.35 Chemeen C10 (10%) | 0 | 20.0 PEG-8 | 444.9 |
| 20 | 100 Ex. C | 57.35 Chemeen C10 (10%) | 27.3 | 17.13 PEG-20 | 451.5 |
| 21 | 100 Ex. C | 1.33 TEOA | 0 | 0 | 428.9 |
| 22 | 100 Acumer | 1.30 TEOA | 0 | 0 | 399.0 |

0.54 grams Tergitol ™ 15-S-40, nonionic surfactant (The Dow Chemical Co., Midland, MI, USA) added to Samples 15 and 16.
amm. = concentrated ammonium hydroxide solution, 28%.
PEG-8 = polyethylene glycol at 8,000 molecular weight (30% solids).
PEG-20 = polyethylene glycol at 20,000 molecular weight (30% solids).
PEG-35 = polyethylene glycol at 35,000 molecular weight (30% solids).
Chemeen™ C10 (PCC Chemax, Inc., Piedmont, SC, USA) is a fatty alkyl ethoxylated amine (100% active ingredient).
Acumer = Acumer ™ 9932 polyacrylic acid, 7,500 molecular weight (Rohm and Haas Co., Philadelphia, PA, USA), 50% solids.
TEOA is triethanolamine (99% active ingredient).

The mechanical properties of the curable thermoset compositions of Table 6 were evaluated as described above in Example 3. The data is presented below in Table 7.

TABLE 7

Hot and room temperature tensile test and elongation results: Samples 15-22

| Sample | Hot TS (N) | Hot Width (%) | RT TS (N) | RT Elong. (%) |
|---|---|---|---|---|
| 15 | 122 | 69 | 367 | 51 |
| 16 | 108 | 70 | 389 | 53 |
| 17 | 131 | 77 | 338 | 26 |
| 18 | 138 | 77 | 395 | 38 |
| 19 | 151 | 82 | 394 | 28 |
| 20 | 125 | 78 | 382 | 42 |
| 21 | 152 | 83 | 329 | 22 |
| 22 | 126 | 80 | 321 | 28 |
| Comp. 3 | 117 | 87 | 490 | 47 |

Comparative 3 is a blend of styrene/acylic latex and melamine formaldehyde resin at 90/10 weight ratio.

In Table 7, the sample labelled Comp. 3 is a control sample which represents the optimized system for the previous generation technology which uses the undesirable melamine-formaldehyde crosslinking systems. Again, Comp. 3 has very good tensile strength properties as well as good room temperature elongation and acceptable hot width retention. Sample 22 is a commercial thermosetting binder, Acumer™ 9932, which is crosslinked with triethanolamine. The data in Table 7 show that this next generation formaldehyde-free technology is comparatively deficient in flexibility and room temperature tensile strength.

Sample 21 also uses triethanolamine as the crosslinking polyol, except with polymer 1C. This sample has similarly poor flexibility as shown by the low room temperature elongation.

Using the same polycarboxy polymer (1C), inventive samples 15-20 show that a good balance of properties can be achieved, including excellent room temperature elongation and good tensile strength, when Chemeen C10 (alkoxylated alkylamine) is used as the crosslinking polyol in conjunction with polyethylene glycol.

The invention claimed is:

1. An aqueous curable composition consisting essentially of:
   (a) at least one polycarboxy homopolymer or polycarboxy copolymer comprising at least two carboxylic acid groups, anhydride groups, or salts thereof; and
   (b) at least one polyol having two hydroxyl groups, selected from the group consisting of an alkoxylated alkylamine and an alkoxylated alkylamide, wherein the aqueous composition does not comprise an emulsion polymer.

2. The aqueous curable composition of claim 1 wherein (a) comprises at least one addition copolymer of (meth)acrylic acid with one or more monomer units selected from the group consisting of $C_1$-$C_{12}$ alkyl(meth)acrylates, $C_1$-$C_{12}$ hydroxyalkyl(meth)acrylates, vinyl esters of $C_2$-$C_{12}$ carboxylic acids, butadiene, and 2-methyl maleic acid.

3. The aqueous curable composition of claim 1 wherein the alkoxylated alkylamine is selected from the group consisting of compounds of Formula I, and wherein the alkoxylated alkylamide is selected from the group consisting of compounds of Formula III:

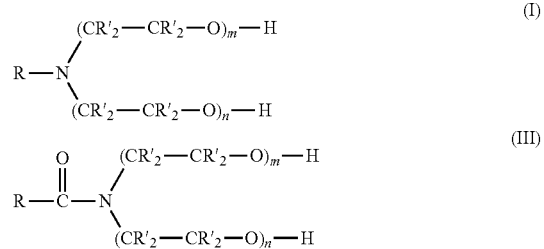

wherein:
R is an alkyl or alkylene radical having at least 6 carbon atoms or an alkylphenyl radical having at least 6 carbon atoms in the alkyl group;
R' independently at each occurrence is H or $C_{1-4}$ alkyl; and
m and n each independently of one another is a number >1.

4. The aqueous curable composition of claim 1 further comprising at least one polyether compound of the formula $$HO—(CR_2—CR_2—O)_x—H,$$

in which R independently at each occurrence is H or $C_{1-4}$ alkyl, and x is between 5 and 100,000.

5. The aqueous curable composition of claim 1 further comprising at least one phosphorous-containing compound.

6. The aqueous curable composition of claim 1 further comprising at least one low molecular weight polybasic carboxylic acid with a weight average molecular weight of 1000 or less, selected from the group consisting of ascorbic acid, aspartic acid, malic acid, crotonic acid, itaconic acid, tartaric acid, glutaric acid, maleic acid, fumaric acid, succinic acid, citric acid, adipic acid, and t-cinnamic acid.

7. The aqueous curable composition of claim 1 further comprising one or more polyols selected from the group consisting of glycerol, ethyleneglycol, diethyleneglycol, triethyleneglycol, hexanediol, trimethylolpropane, pentaerythritol, sorbitol, sucrose, glucose, triethanolamine and diethanolamine at a level of from 1% to 10% by weight based on total formulation solids.

8. The aqueous curable composition of claim 1, wherein the polycarboxy homopolymer (a) is polyacrylic acid.

9. A method for treating fibrous, non-woven or composite substrates comprising:
   forming a curable aqueous composition by admixing with water or a mixture of water and one or more water-miscible solvent (a) at least one polycarboxy homopolymer or copolymer comprising at least two carboxylic acid groups, anhydride groups, or salts thereof; and
   (b) at least one polyol having two hydroxyl groups, selected from the group consisting of an alkoxylated alkylamine, and an alkoxylated alkylamide wherein the aqueous composition does not comprise an emulsion polymer and component (a) is in the form of a solution in an aqueous medium;
   contacting a substrate with said curable aqueous composition or, alternatively, applying said curable aqueous composition to said substrate; and
   heating said curable aqueous composition at a temperature of from 100° C. to 400° C.

10. A fibrous article, non-woven article or composite substrate prepared by the method as claimed in claim 9.

* * * * *